United States Patent
Yang et al.

(10) Patent No.: US 9,490,322 B2
(45) Date of Patent: Nov. 8, 2016

(54) SEMICONDUCTOR DEVICE WITH ENHANCED 3D RESURF

(71) Applicants: Hongning Yang, Chandler, AZ (US); Xin Lin, Phoenix, AZ (US); Zhihong Zhang, Chandler, AZ (US); Jiang-Kai Zuo, Chandler, AZ (US)

(72) Inventors: Hongning Yang, Chandler, AZ (US); Xin Lin, Phoenix, AZ (US); Zhihong Zhang, Chandler, AZ (US); Jiang-Kai Zuo, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 193 days.

(21) Appl. No.: 13/748,076

(22) Filed: Jan. 23, 2013

(65) Prior Publication Data

US 2014/0203358 A1 Jul. 24, 2014

(51) Int. Cl.
| | |
|---|---|
| *H01L 29/94* | (2006.01) |
| *H01L 29/08* | (2006.01) |
| *H01L 29/78* | (2006.01) |
| *H01L 29/06* | (2006.01) |
| *H01L 29/10* | (2006.01) |

(52) U.S. Cl.
CPC ....... *H01L 29/0847* (2013.01); *H01L 29/0653* (2013.01); *H01L 29/0692* (2013.01); *H01L 29/7835* (2013.01); *H01L 29/1045* (2013.01)

(58) Field of Classification Search
CPC ..................... H01L 29/7816; H01L 29/7833; H01L 29/66681
USPC .................................. 257/335, 343, E29.256
See application file for complete search history.

(56) References Cited

U.S. PATENT DOCUMENTS

| | | |
|---|---|---|
| 5,216,275 A | 6/1993 | Chen |
| 5,386,136 A | 1/1995 | Williams et al. |
| 5,438,215 A | 8/1995 | Tihanyi |
| 5,923,071 A | 7/1999 | Saito |
| 5,932,897 A | 8/1999 | Kawaguchi et al. |
| 6,137,140 A | 10/2000 | Efland et al. |
| 6,211,552 B1 | 4/2001 | Efland et al. |
| 6,552,390 B2 | 4/2003 | Kameda |
| 6,882,023 B2 | 4/2005 | Khemka et al. |
| 7,282,765 B2 | 10/2007 | Xu et al. |
| 7,466,006 B2 | 12/2008 | Khemka et al. |
| 7,473,978 B2 | 1/2009 | Matsudai et al. |
| 7,511,319 B2 | 3/2009 | Zhu et al. |
| 7,535,058 B2 | 5/2009 | Liu et al. |
| 7,569,884 B2 | 8/2009 | Lee |
| 7,977,715 B2 | 7/2011 | Cai |
| 8,039,902 B2 | 10/2011 | Kim et al. |

(Continued)

OTHER PUBLICATIONS

Merchant et al., "Dependence of Breakdown Voltage on Drift Length and Buried Oxide Thickness in SOI RESURF LDMOS Transistors", Proceedings of the 5th International Symposium on Power Semiconductor Devices and ICs, IEEE, 1993, pp. 124-128, ISBN 0-7803-1313-5.

(Continued)

*Primary Examiner* — Samuel Gebremariam
(74) *Attorney, Agent, or Firm* — Sherry W. Schumm (57) ABSTRACT

A device includes a semiconductor substrate, source and drain regions in the semiconductor substrate and spaced from one another along a first lateral dimension, and a drift region in the semiconductor substrate and through which charge carriers drift during operation upon application of a bias voltage between the source and drain regions. The drift region has a notched dopant profile in a second lateral dimension along an interface between the drift region and the drain region.

20 Claims, 4 Drawing Sheets

(56) References Cited

U.S. PATENT DOCUMENTS

| | | |
|---|---|---|
| 8,159,029 B2 | 4/2012 | Su et al. |
| 8,193,585 B2 | 6/2012 | Grote et al. |
| 8,269,275 B2 | 9/2012 | Chen et al. |
| 8,282,722 B2 | 10/2012 | Vonwiller et al. |
| 8,304,831 B2 | 11/2012 | Zhu et al. |
| 8,330,220 B2 | 12/2012 | Khan et al. |
| 8,350,327 B2 | 1/2013 | Chung et al. |
| 8,716,791 B1 | 5/2014 | Iravani et al. |
| 8,809,952 B2 | 8/2014 | Landgraf et al. |
| 9,136,323 B2 | 9/2015 | Yang et al. |
| 2001/0025961 A1 | 10/2001 | Nakamura et al. |
| 2001/0038125 A1 | 11/2001 | Ohyanagi et al. |
| 2002/0017697 A1 | 2/2002 | Kitamura et al. |
| 2006/0267044 A1 | 11/2006 | Yang |
| 2007/0246771 A1 | 10/2007 | McCormack et al. |
| 2007/0278568 A1 | 12/2007 | Williams et al. |
| 2008/0054994 A1 | 3/2008 | Shibib et al. |
| 2008/0067615 A1 | 3/2008 | Kim |
| 2008/0090347 A1 | 4/2008 | Huang |
| 2008/0191277 A1 | 8/2008 | Disney et al. |
| 2008/0246086 A1 | 10/2008 | Korec et al. |
| 2009/0020813 A1 | 1/2009 | Voldman |
| 2011/0127607 A1 | 6/2011 | Cai |
| 2011/0260247 A1 | 10/2011 | Yang et al. |
| 2012/0126323 A1* | 5/2012 | Wu et al. ............. 257/343 |
| 2012/0126324 A1 | 5/2012 | Takeda et al. |
| 2012/0161233 A1 | 6/2012 | Ito |
| 2012/0205738 A1 | 8/2012 | Yang et al. |
| 2013/0015523 A1 | 1/2013 | You |
| 2014/0264588 A1 | 9/2014 | Chen et al. |

OTHER PUBLICATIONS

Vijay Parthasarathy et al., "A Double RESURF LDMOS with Drain Profile Engineering for Improved ESD Robustness," IEEE Electron Device Letter, vol. 23, No. 4, pp. 212-214 (2002).

R. Zhu et al., "Engineering RESURF LDMOSFETs for Robust SOA, ESD Protection and Energy Capability," 19$^{th}$ ISPSD, pp. 185-188 (2007).

L. Lorenz et al., "COOLMOS—A New Milestone in High Voltage Power MOS," published at ISPSD, 8 pages, 1999.

T. Fujihira et al., "Simulated Superior Performances of Semiconductor Superjunction Devices," hoc. of the ISPSD, pp. 423-426, Jun. 1998.

U.S. Appl. No. 13/465,761, "Semiconductor Device with Drain-End Drift Diminution," filed May 7, 2012.

Notice of Allowance mailed Jun. 6, 2014 for U.S. Appl. No. 13/465,761, 9 pages.

Non-Final Office Action mailed Jan. 30, 2014 for U.S. Appl. No. 13/465,761, 18 pages.

Final Office Action mailed Oct. 25, 2013 for U.S. Appl. No. 13/465,761, 15 pages.

Non-Final Office Action mailed Jun. 27, 2013 for U.S. Appl. No. 13/465,761, 16 pages.

Restriction Requirement mailed Apr. 29, 2013 for U.S. Appl. No. 13/465,761, 7 pages.

Notice of Allowance mailed May 13, 2015 for U.S. Appl. No. 14/486,104, 10 pages.

* cited by examiner

SEMICONDUCTOR DEVICE WITH ENHANCED 3D RESURF

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying substrate.

LDMOS devices are often used in applications, such as automotive applications, involving operational voltages greater than 40 volts. Breakdown resulting from applying such high voltages to the drain is often prevented through a reduced surface field (RESURF) structure in the LDMOS device design. The RESURF structure is designed to deplete the drift space of the LDMOS device in both vertical and lateral directions, thereby reducing the electric field near the surface at the drift region and thus raising the off-state breakdown voltage (BVdss) of the device.

Typically a trade-off exists between BVdss and drain-source ON-resistance (Rdson). BVdss determines the achievable output voltage rating for the device. Rdson determines the device area required to handle a given amount of current, e.g., the current or power rating of the device. Designing a device to achieve a higher BVdss level (and therefore higher operating voltage) is often at the cost of increased Rdson (and thus lower current rating per unit area). For example, the BVdss level may be increased by increasing the length of the drift space of the device or reducing the dopant concentration in the drift space, both of which increase Rdson. Conversely, designing a device to reduce Rdson (and thus increase the current rating per unit area) leads to lower BVdss levels (and thus lower operating voltage). For example, a higher dopant concentration in the drift space lowers Rdson at the expense of a lower BVdss. Other Rdson reduction techniques involve increasing device area and, thus, the manufacturing cost of the device.

BRIEF DESCRIPTION OF THE DRAWINGS

The components and the figures are not necessarily to scale, emphasis instead being placed upon illustrating the principles of the various embodiments. Moreover, in the figures, like reference numerals designate corresponding parts throughout the different views.

DETAILED DESCRIPTION OF THE PRESENTLY PREFERRED EMBODIMENTS

Embodiments of laterally diffused metal oxide semiconductor (LDMOS) and other power transistor devices and electronic apparatus with enhanced three-dimensional (3D) reduced surface field (RESURF) effects are described. The device and apparatus embodiments may have a drift region configured with a notched dopant profile. The dopant profile may be notched in or along a lateral dimension orthogonal to a conduction path of the device. For example, the dopant profile may be notched along a lateral dimension orthogonal to a lateral dimension along which source and drain regions are spaced from one another. The enhancement of the RESURF effect may extend the breakdown voltage level (BVdss) of the disclosed device embodiments beyond levels achieved via two-dimensional RESURF effects.

In some embodiments, the notched dopant profile includes a comb-shaped structure in the drift region along an interface with the drain region. The comb structure may include a periodic notch pattern. Each notch or slot in the pattern may be filled with or include lightly doped p-type semiconductor material, such as portions of a p-type epitaxial layer in which the drift region is formed. The interface along the comb structure may enhance the depletion of the drift region from the lateral dimension along which the notch pattern is formed. Such benefits are achieved without an additional implant layer or fabrication step.

The notched dopant profile of the drift region may be combined with other features of the drift region that together diminish the drift region to promote depletion at, under, or otherwise near the drain region. For example, the drift region may present an open drain structure in which a cutoff or inner edge of the drift region under the drain defines an opening in the drift region. The cutoff or edge may be an artifact of a similar cutoff or edge of a well region (used to form the drift region) near the drain region. The opening may have one or more notched boundaries to present the notched dopant profile. While the open drain structure may enhance the RESURF effect for devices having a long drift length (e.g., trench isolation lengths over 5 µm) by diminishing the drift region near the drain, thereby increasing BVdss levels up to 130 Volts, combining the open drain structure with the notched boundary to form the comb structure may further enhance the depletion. BVdss levels may be further increased beyond 130 Volts, e.g., up to 139 Volts. Although described in connection with embodiments having a combination of the open drain structure and a notched drain-side boundary, the notched dopant profile of the disclosed embodiments may be incorporated into closed drain structures, in which the drift region extends laterally across the drain region after diffusion of the dopant implanted in the well region.

The notched dopant profile may provide a multi-dimensional RESURF effect (e.g., lateral and vertical) to improve the BVdss of the disclosed device embodiments. The benefit of the RESURF effect is achieved, however, with additional design flexibility in the trade-off between the off-state breakdown voltage level (BVdss) and the on-state resistance value (Rdson). The BVdss and Rdson values may thus be tuned or customized for a specific device or application by adjusting the width (or size) and spacing of the notches in the dopant profile. The width and the spacing provide additional variables, or degrees of freedom, to be manipulated during the design of devices configured in accordance with the disclosure. An optimum balance between BVdss and Rdson may be attained by adjusting the width of the notches or the regions between the notches. Such additional design flexibility may allow other electrical characteristics of the disclosed device embodiments to be optimized or adjusted. For example, hot carriers generated by impact ionization may be minimized without sacrificing BVdss or Rdson through overall design optimization. Such optimization and customization may be provided without changing or adding fabrication process steps.

Although described below in connection with embodiments having a periodic comb-shaped opening along a drift region boundary surrounding the drain region (or comb-shaped dopant profile near the drain region), several other patterns or structures are possible. For example, the boundary need not be comb-shaped. The size and shape of the notches may vary from the examples shown. The notches (and/or the protrusions defined by the notches) may have a triangular, trapezoidal, oval, sinusoidal, or other cross-sectional shape rather than the comb-shaped boundaries shown. The lateral extent of the notches and/or the drain region may also vary, as described herein.

Although described below in connection with n-channel LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. The drift regions of the disclosed devices may be useful in a wide variety of power electronic devices. The drift regions are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. Thus, p-type islands or other regions are described for an n-type drift region. However, the disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

Figure 1:
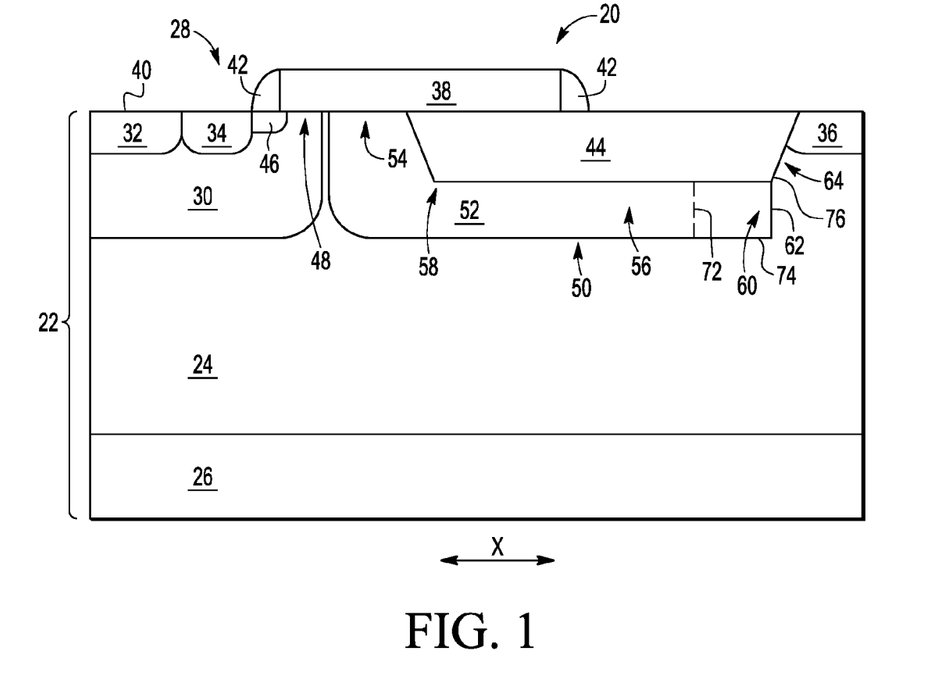
FIG. 1 is a cross-sectional, schematic, partial view of an exemplary LDMOS transistor with a drift region having a notched dopant profile configured in accordance with one embodiment.

FIG. 1 is a schematic cross-sectional view of an example of an n-channel LDMOS device 20 constructed in accordance with one embodiment. The device 20 may be configured as a RESURF transistor. The device 20 includes a semiconductor substrate 22, which may, in turn, include a number of epitaxial layers 24. In this example, the semiconductor substrate 22 includes a single p-type epitaxial layer P-EPI grown on an original substrate 26. The original substrate 26 may be a heavily doped p-type substrate in some cases, such as those having multiple epitaxial layers. The device 20 may alternatively or additionally include non-epitaxial layers in which one or more device regions are formed. Any one or more of the layers of the semiconductor substrate 22 may include silicon. The structural, material, and other characteristics of the semiconductor substrate 22 may vary from the example shown. For example, the semiconductor substrate 22 may include a silicon-on-insulator (SOI) construction. Additional, fewer, or alternative layers may be included in the semiconductor substrate 22. For example, any number of additional semiconductor and/or non-semiconductor layers may be included. The disclosed devices are thus not limited to, for instance, bulk silicon substrates or substrates including epitaxially grown layers, and instead may be supported by a wide variety of other types of semiconductor substrates.

A device area 28 of the device 20 is depicted in FIG. 1. For some embodiments, only one side or half of the device area 28 is shown. For example, the device area 28 may be laterally symmetrical and, thus include a portion that mirrors the portion shown (see, e.g., FIGS. 2 and 3).

The device area 28 may be defined by one or more doped device isolating layers or regions (not shown) in the semiconductor substrate 22 (e.g., the epitaxial layer 24). The doped isolating layer(s) or region(s) may laterally and/or otherwise surround the device area 28. These layers or regions act as a barrier or isolation layer separating the device area 28 from the rest of the substrate 22 (or the original substrate 26). In some cases, a buried n-type layer may be formed or disposed in the semiconductor substrate 22. For example, the buried n-type layer may be formed in the semiconductor substrate 22 before the growth of the epitaxial layer 24 thereof. The buried n-type layer may extend laterally across (e.g., under) the device area 28 to act as a barrier or isolation layer separating the active area 28 from the original substrate 26. The buried n-type layer may alternatively or additionally assist in drift region depletion to support the RESURF effect described below. The buried n-type layer may constitute one of multiple doped device isolating regions (not shown) surrounding the device area 28. For example, a moderately or heavily doped n-type isolation well (not shown) may laterally surround the device area 28. The isolation well may be ring-shaped. The isolation well may be disposed on or otherwise above the buried n-type layer and outside of, or along, the lateral periphery of the device area 28. One or more of the above-described isolating regions may have a dopant concentration level and/or be otherwise configured for high voltage (HV) operation (e.g., high side operation in which the terminals of the device 20 are level shifted relative to the semiconductor substrate 22, which is typically grounded), including punch-through prevention. Any number of the device isolation wells, sinks, or buried layers may be connected to one another. Additional, fewer, or alternative device isolation layers or regions may be provided in the semiconductor substrate 22.

The device 20 includes a device body or body region 30 in the semiconductor substrate 22. In this example, the body region 30 is a p-type well formed in the epitaxial layer 24 of the substrate 22. The p-type well may be configured for high voltage operation (e.g., high side operation). The body region 30 may be biased via one or more heavily doped p-type body contact regions or electrodes 32 formed in or otherwise above the p-type well of the body region 30 in the semiconductor substrate 22. The dopant concentration of each contact region 32 may be at a level sufficient to establish an ohmic contact to the body region 30.

The device 20 includes heavily doped source and drain regions 34 and 36 in the semiconductor substrate 22. The source and drain regions 34 and 36 are laterally spaced from one another in the lateral dimension shown in the cross-section of FIG. 1. In some embodiments, the source and drain regions 34 and 36 may have additional or alternative lateral spacing. Any number of source or drain regions 34, 36 may be provided. The drain region 36 need not be centered or otherwise disposed between, or laterally surrounded by, the source region 34 as shown. In this example, the source and drain regions 34 and 36 are n-type doped portions of the epitaxial layer 24. The heavily doped n-type source region 34 is disposed within, on, and/or otherwise above the body region 30. The heavily n-type doped drain region 36 is spaced from the body region 30 along the lateral dimension shown in FIG. 1. Such spacing defines a conduction path of the device between the source and drain regions 34 and 36. The conduction path may thus be oriented along the lateral dimension shown in FIG. 1. The regions 34, 36, or a portion thereof, may have a dopant concentration at a level sufficient to establish ohmic contacts for biasing the source region 34 and the drain region 36. In a typical LDMOS configuration, the drain region 36 is biased at a relatively high drain-source voltage, Vds, relative to the source region 34.

Figure 2:
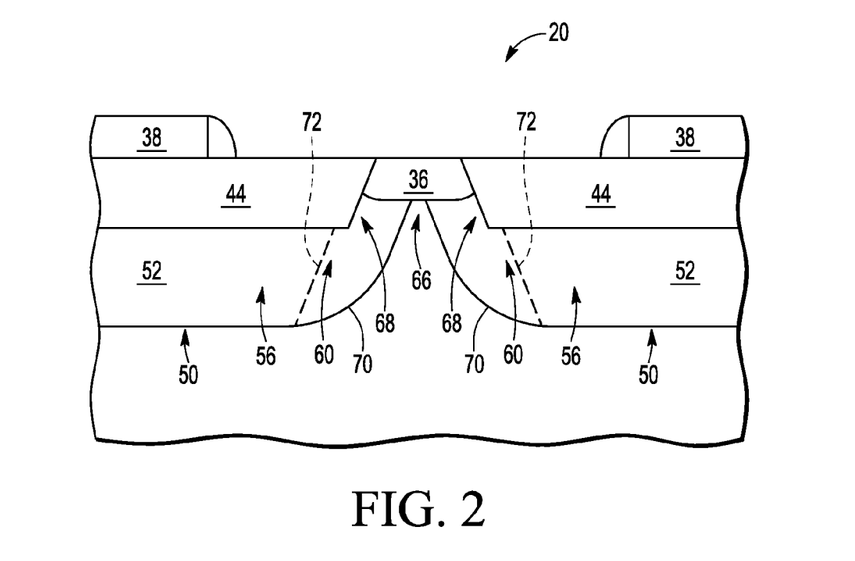
FIG. 2 is a cross-sectional, schematic, partial view of the exemplary LDMOS transistor of FIG. 1 to depict the drift region after an annealing step.
Figure 3:
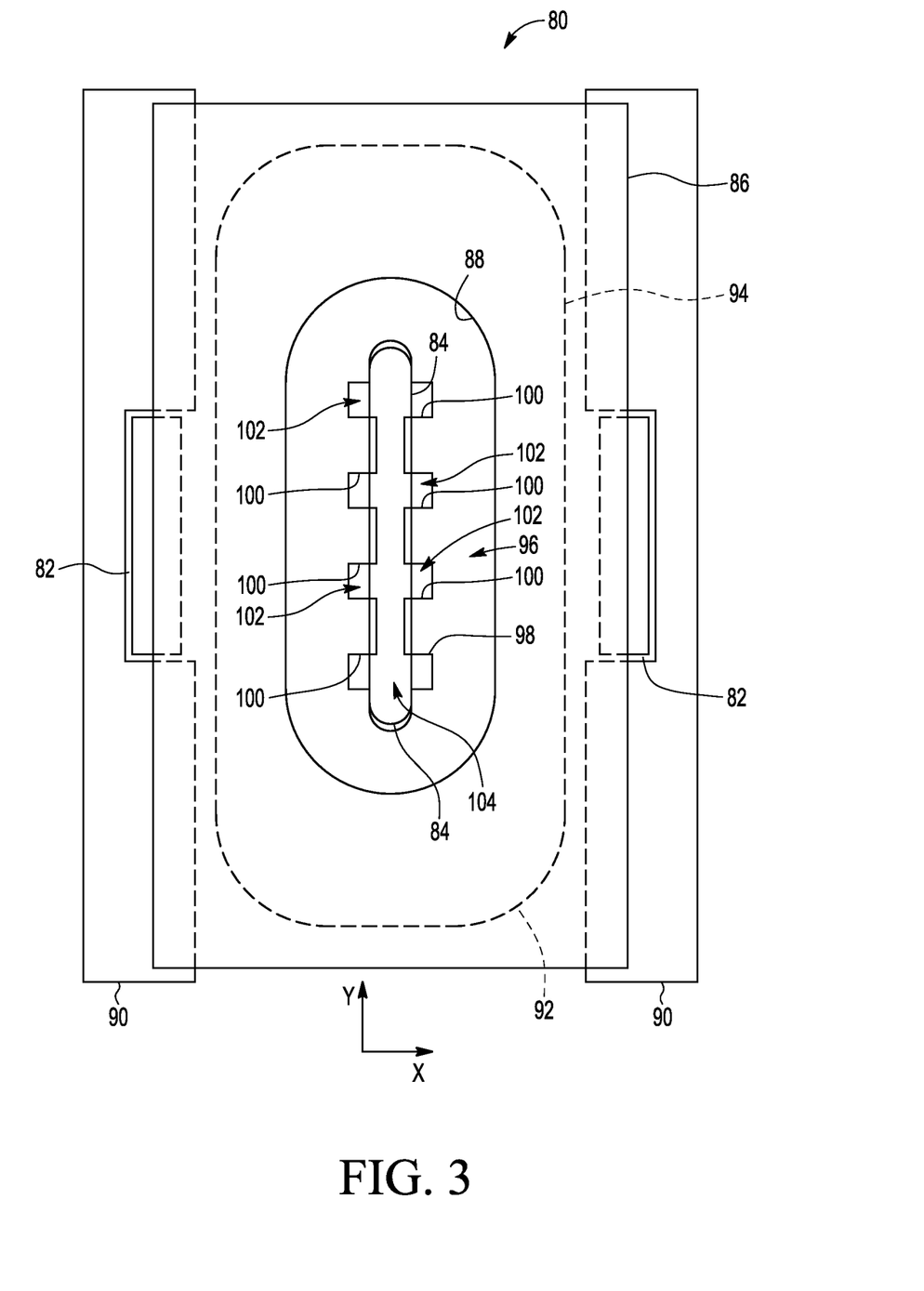
FIG. 3 is a plan view of an exemplary LDMOS transistor having a drift region with a notched dopant profile in accordance with one embodiment.

The device 20 includes one or more gate structures 38 formed on or above a surface 40 of the semiconductor substrate 22. The gate structure 38 is disposed between the source region 34 and the drain region 36. In some embodiments, the gate structure 38 surrounds the drain region 36, which may be centrally or internally disposed within the device area 28, as shown in FIGS. 2 and 3. Alternatively, the gate structure 38 may be arranged in a dual gate finger configuration in which two transistors are symmetrically arranged to share the same drain region 36. The gate structure 38 is located on or above a gate dielectric (not shown). For example, the gate dielectric may include silicon dioxide (or oxide) deposited or otherwise formed on the surface 40. Each gate structure 38 includes a conductive gate layer (e.g., a polysilicon plate) on or above the gate dielectric, which insulates the conductive gate layer from the substrate 22. The gate structure 38 may include one or more dielectric sidewall spacers 42 disposed along lateral edges of the gate structure 38. The sidewall spacers 42 may cover the lateral edges to act as a silicide blocker to prevent a silicide short along the surface 40. The sidewall spacers 42 may provide spacing to separate the conductive components of the gate structure 38 from the source region 34 and other regions of the device region 28. In this example, one of the sidewall spacers 42 is used for alignment purposes in defining an edge of the source region 34.

The configuration of the gate structure 38 may vary. The configuration of the gate structure 38 may include multiple conductive layers (e.g., polysilicon plates). The components, materials, and other characteristics of the gate structure 38 may vary from the example shown.

A number of shallow trench isolation (STI) regions 44 may be formed at the surface 40 in the semiconductor substrate 22. In this embodiment, an STI region 44 spaces the gate structure 38 from the high voltage applied to the drain region 36. These and other ones of the STI regions 44 may be configured to prevent or minimize hot carrier injection (HCI) into the oxide layer of the gate structure 38.

Other STI regions may be disposed in the semiconductor substrate 22 to isolate or separate various contact regions, such as the body contact region 32 and the source region 34, as well as other regions for biasing components of the device 20. For example, an isolation contact region and a substrate contact region may be separated by one of the STI regions 44.

The device 20 may be configured with one or more lightly or intermediately doped transition regions (e.g., n-type lightly doped drain, or NLDD, regions) at or near the source and drain regions 34 and 36. Each transition region may be or include a diffused region formed in connection with the source region 34 and/or the drain region 36. Such transition regions may assist in controlling the electric field at or near the surface 40, including in areas other than those areas near the source region 34 or the drain region 36. In this example, the device 20 includes an NLDD region 46 adjacent the source region 34. The NLDD region 46 may extend laterally under the gate structure 38 as shown.

When the gate structure 44 is biased, charge carriers (in this case, electrons; alternatively, holes) accumulate in one or more channel areas or regions 48. Each channel region 48 (or a portion thereof) may be located in the body region 30 under the gate structure 38. In this example, the accumulation of electrons results in a charge inversion in the channel region 48 from the p-type body region 30 to an n-type conduction layer or area near the surface 40 of the semiconductor substrate 22. Once a sufficient amount of the charge carriers accumulate in the conduction layer or area, charge carriers are capable of flowing from the source region 34 toward the drain region 36 through the channel region 48.

The channel region 48 may include other regions or areas in the semiconductor substrate 22 in which charge inversion or accumulation occurs as a result of the bias applied to the gate structure 38. Charge carriers may also accumulate outside of or beyond the body region 30. For example, charge carriers may accumulate in a region of the epitaxial layer 24 adjacent the body region 30. This area may, in some cases, be considered to be part of an accumulation region of the device 20. The channel region 48 and the accumulation region may form part of a conduction region or path of the device 20.

The conduction path of the device 20 is not limited to regions in which charge inversion occurs or to regions in which conduction is enabled or enhanced via the bias voltage applied to the gate structure 38. The conduction path or regions of the device 20 are thus not limited to regions at or near the surface 40. For example, the conduction path includes a portion of a drift region 50 of an LDMOS device through which charge carriers drift to reach the drain region 36. The drift region 50 may electrically couple the drain region 36 and the channel region 48. In this example, the drift region 50 corresponds with a portion of an n-type well 52 under the STI region 44. Further details regarding the drift region 50 of the device 20 are set forth below.

The n-type well 52 may laterally extend under the gate structure 38 to form an accumulation region 54 of the device 20. The accumulation region 54 may be disposed along the surface 40 rather than under the STI region 44. During operation, charge carriers accumulate in the accumulation region 54 before drifting through the drift region 50. The conduction path of the device 20 may include additional or alternative areas or regions having a different conductivity type than the body region 30.

In the embodiment of FIG. 1, the drift region 50 is configured as a field drift region. The STI region 44 is disposed between the accumulation region 54 and the drain region 36. Alternative or additional field isolation structures may be disposed between the accumulation region 54 and the drain region 36. The field isolation structures may include one or more field plates disposed above the surface 40.

The conduction path or regions of the device 20 may include still other regions, whether n-type or p-type, at or near the surface 40. For example, the channel region 48 and/or other conduction region of the device 20 may include one or more intermediately doped n-type transition regions (e.g., one of the NLDD regions 46 described above) in the semiconductor substrate 22.

The path along which the charge carriers flow from the source region 34 to the drain region 36 passes through the drift region 50 in the semiconductor substrate 22. The drift region 50 may be configured to allow the charge carriers to drift under the electric field established by the drain-source voltage applied between the drain region 36 and the source region 34. The drift region 50 (or one or more portions thereof) thus forms part of the conduction path of the device 20. During operation, the drift region 50 electrically couples the drain region 36 to the channel region 48 and the source region 36.

The drift region 50 may be configured for depletion during operation to reduce the magnitude of the electric field, via the reduced surface field (RESURF) effect, in various locations in the device area 28 for improved breakdown performance. In this example, a junction forms between the n-type well 52 and the p-type epitaxial layer 24 and/or the body region 30 to establish a RESURF effect directed to decreasing the electric field in areas in and/or around the drift region 50. The n-type well 52 and/or the drift region 50 may be adjacent to, and/or spaced from, the body region 30. A decreased electric field may avoid breakdown along the conduction path, and thereby increase the intrinsic breakdown voltage (BVdss) of the device 20. The drift region 50 may be further configured to achieve both a high breakdown voltage level and a low drain-source resistance (Rdson) by leveling the electric field in certain locations within the drift region 50. The drift region 50 may be depleted both laterally and vertically, at least in part, during operation along reverse-biased PN junctions with, for instance, the epitaxial layer 24 and/or the body region 30. The junctions are reverse biased as a result of the application of a drain voltage Vds between the source region 34 and the drain region 36. The reverse-biased junctions may reduce the electric field, as in the RESURF effect, for improved breakdown performance. In an alternative embodiment, the device 20 may be configured to establish a double RESURF effect, in which, for example, one or more additional regions may be disposed adjacent (e.g., below or under) the drift region 50 for further depletion in the device area 28. Further details regarding the structural and operational characteristics of suitable RESURF regions are set forth in U.S. Pat. No. 6,882,023 ("Floating RESURF LDMOSFET and Method of Manufacturing Same").

The drift region 50 includes a field drift portion or section 56 under the STI region 44. The field drift section 56 may have a lateral length of approximately 5 microns or more. The field drift section 56 extends from a channel or accumulation side (or end) 58 to a drain side (or end) 60 of the drift region 50. During operation, charge carriers drift from the channel side 58 to the drain side 60 through the field drift section 56 under the electric field arising from the drain-source bias voltage. In this example, the charge carriers reach the channel side 58 after exiting the channel region 48 and/or the accumulation region 54. The charge carriers then drift around the STI region 44 through the field drift section 56 to reach the drain side 60.

The drift region 50 may be configured to present one or more dopant concentration levels in the field drift section 56 and at the channel and drain sides 58, 60 to establish a suitable Rdson value. The dopant concentration level may vary over the depth of the field drift section 56 and/or at the channel side 58 and/or the drain side 60. For example, the dopant concentration level in the field drift section 56 (and/or at the channel side 58 and/or the drain side 60) may be higher near the STI region 44 than near the PN junction with the epitaxial layer 24. Alternatively or additionally, the dopant concentration level in the field drift section 56 may vary as a function of lateral position. For example, the dopant concentration level at a given depth at the drain side 60 may decrease as the lateral distance to the drain region 36 decreases. The dopant concentration level in the drift region 50 at a given depth may further decrease with increasing overlap with the drain region 36. In some cases (see, e.g., FIG. 2), the dopant concentration level may decrease to an extent that an opening is formed in the drift region 50 under the drain region 36. The dopant concentration level in the field drift section 56 at or along the drain side 60 may vary in another lateral dimension (e.g., the lateral dimension orthogonal to the one shown in FIG. 1), as described below.

The drain side or end 60 of the drift region 50 is shown in FIG. 1 before a thermal anneal or other fabrication step(s) forms a connection between the drift region 50 and the drain region 36. In the embodiment shown in FIG. 1, the n-type well 52 does not laterally overlap with the drain region 36 prior to the anneal or other fabrication step(s). The n-type well 52 is formed with a cutoff or edge 62 laterally spaced from the drain region 36. In this example, the n-type well 52 is configured such that the edge 62 has an upright or vertical wall. A thermal anneal after an implant that forms the n-type well 52 may smoothen the sharp edge(s) of the wall. The cutoff 62 in this example is positioned under the STI region 44. In other embodiments, the cutoff 62 is positioned under the drain region 36 such that the n-type well 52 does not laterally extend across the drain region 36 before the thermal anneal. The cutoff 62 may be oriented non-vertically in other embodiments.

A connection between the drain and drift regions 36, 50 is formed through diffusion of dopant from one or both of the n-type well 52 and the drain region 36. Such diffusion results in the spreading of dopant into a space 64 between the n-type well 52 and the drain region 36. The spreading may include lateral spreading in the lateral dimension shown in FIG. 1. The diffusion may also include a vertical component. For example, dopant from the drain region 36 may diffuse downward (as well as laterally outward) into the semiconductor substrate 22. Alternatively or additionally, dopant from the n-type well 52 may diffuse upward (as well as laterally inward). Eventually, the diffusion establishes one or more current passes or paths in the space 64 between the n-type well 52 and the drain region 36. The current paths may be positioned along the STI region 44. The current paths may provide a low resistance path through which the charge carriers drift during operation under the applied bias voltage. Any adverse effects on the on-resistance of the device 20 arising from the cut-off or edge 62 may thus be avoided.

The cutoff or edge 62 at the drain side 60 of the drift region 50 is configured such that the drift region 50 is diminished under the drain region 36. For example, the drift region 50 may have a lateral profile that varies across the drain region 36 in the lateral dimension shown in FIG. 1. Such diminution of the drift region 50 may allow the drift region 50 to be fully depleted under or along the drain region 36 during operation despite the distance from the PN junction between the n-type well 52 and the body region (and/or the p-type epitaxial layer 24). Such diminution may be useful in devices having long drift lengths. The drift region 50 may be further diminished at, along, or near the drain region 36 in a further manner, as described below in connection with a notched dopant profile.

FIG. 1 may also depict the device 20 in simplified form in the sense that only one side of the device 20 is shown. The device 20 may include another side configured in a manner similar to the depicted side. For example, the other side of the device 20 may mirror or match the depicted side, such that the device 20 is symmetrical about the drain region 36. The drain region 36 may thus be disposed in the center (or along a central line) of the device 20. The other side may thus include a second source region separated from the drain region 36 by a second gate structure. In some embodiments, the second source region and the second gate structure are contiguously formed with the corresponding regions of the device 20 described above via one or more connecting structures offset from the lateral cross-section shown in FIG. 1. For example, the gate structure 38 may be U-shaped or arch-shaped (e.g., a single lateral connection) or toroidal or looped (e.g., two lateral connections) when viewed from above (see, e.g., FIG. 3). The shapes of the above-described regions of the device 20 may vary considerably from these examples.

FIG. 2 depicts a cross-sectional view of an inner or central portion of the device 20, from the gate structure(s) 38 inward to the drain region 36, to show respective portions of both sides of the device 20. The sides of the device 20 are symmetrically oriented around the central drain region 36. The cross-sectional view presents an exemplary lateral profile of the drift region 50 after the diffusion has spread the dopant beyond the boundaries of the regions shown in FIG. 1. The drift region 50 is electrically connected with the drain region 36, but the diffusion does not, in this example, lead to the drift region 50 extending fully across the entire lateral extent of the drain region 36 in the lateral dimension shown. The drift region 50 includes an opening 66 under the drain region 36. In this example, the opening 66 is positioned between current passes or paths 68 of the drift region 50 formed by the diffusion. The current paths 68 electrically link the drain region 36 to the field drift section 56 of the drift region 50 and the remainder of the conduction path of the device 20.

The opening 66 in the drift region 50 diminishes the drift region 50 at or near the drain region 36 to increase the extent to which the drift region 50 is depleted under or near the drain region 36 during operation. In some cases, the diminishment of the drift region 50 leads to the full depletion of the drift region 50 under or near the drain region 36 during operation. The RESURF effect may thus be enhanced despite conditions (e.g., a long field drift region) that may otherwise limit the RESURF effect. The spreading of the dopant to establish the connection between drain and drift regions 36, 50 may also lead to such diminution. Moreover, with the current paths 68, the charge carriers may reach the drain region 72 without encountering an area of low dopant concentration or high resistivity. The enhancement of the RESURF effect may thus be provided while maintaining one or more low-resistance path(s) for the charge carriers.

In this example, each current path 68 extends along the STI region 44 from a respective one of the drain sides 60 of the field drift section 56 only partially across the drain region 36 as shown. As the current paths 68 extend inward to reach the drain region 36, the depth of a lower boundary 70 of the drift region 50 decreases. Diffusion from the drain region 36 may contribute to the formation of the current paths 68, but the current paths 68 may be considered an inner section of the drift region 50 surrounded by an outer section of the drift region (e.g., the field drift section 56). The inner section of the drift region may be shallower, thinner, less doped, and/or otherwise diminished relative to the outer section. Full or increased depletion of the drift region may thus be attained.

Due to the diffusion, the drain side 60 and/or the current paths 68 may have sloped boundaries, such as the lower boundary 70, rather than an upright wall. The drift region 50 may also narrow (in vertical thickness) at the drain side 60 as a result of the cutoff 62 (FIG. 1) and the diffusion. For example, the vertical thickness of the current paths 68 may be lower than the vertical thickness of the field drift section 56 of the drift region 50. The shape of the current paths 68 may vary. The current paths 68 may have a dopant concentration level configured for a suitable or acceptable on-resistance. The dopant concentration level may decrease as the spacing or distance from the STI region 44 increases.

One or more parameters or characteristics of the device 20 may be configured to ensure that the opening 66 remains between the current paths 68 despite the diffusion. Examples include the lateral position of the edge 62 (FIG. 1), the dose and energy of the implant that forms the drain region 36, and the depth of the STI region 44.

By cutting off the lateral extent of the drift region 50 under the drain region 36, the device 20 may avoid operational conditions in which some (e.g., an inner portion) of the drift region 50 is not fully depleted, which may reduce the RESURF effect. The cutoff 62 may thus remove the portion of a conventional drift region in which depletion is less likely to occur due to the length of the field drift section 56.

The shape, dopant concentration level, and other characteristics of the current paths 68 (and, thus, the drift region 50) may vary from the example shown. For example, the lateral width of the current paths 68 (and, thus, the drift region 50) in the lateral dimension shown may vary. The dopant concentration level of the current paths 68 may alternatively or additionally vary. The extent to which the drift region 54 extends across the lateral width of the drain region 38 may vary accordingly. These characteristics may be adjusted or configured by changing the lateral position of the cutoff 62 (FIG. 1).

In some alternative embodiments, the drift region 50 is still diminished under the drain region 36, but without the opening 66. For example, the drift region 50 may narrow (in vertical thickness) at the drain region 36 to define the current paths 68. In such cases, a portion of the current paths 68 (or other dopant diffusing from the n-type well 52 (FIG. 1) or the drain region 36) may extend across the drain region 36. The dopant concentration level in such areas under the drain region 36 may be lower than the level along the STI region 44 through which the charge carriers drift to reach the drain region 36. The concentration level may thus decrease at a given depth as the distance from the STI region 44 increases (until the center of the device 20 is reached). The concentration level under the drain region 36 may additionally or alternatively decrease with increasing depth. The diminution of the drift region 50 under the drain region 36 may accordingly include a lowered dopant concentration level relative to the levels reached in the field drift section 56 of the drift region 50.

The dopant concentration levels and other characteristics of the drift region 50 (with or without an opening under the drain region 36) may vary as described in co-pending and commonly assigned U.S. patent application Ser. No. 13/465,761, filed May 7, 2012, and entitled "Semiconductor Device with Drain-End Drift Diminution."

With reference again to FIG. 1, the drift region 50 may also be diminished at or along the interface with the drain region 36 via further patterning. The patterning may be in a lateral dimension orthogonal to the lateral dimension shown in FIG. 1. The source and drain regions 34, 36 are spaced from one another in the lateral dimension shown in FIG. 1. That lateral dimension corresponds with a line X shown in FIG. 1, which corresponds with the general direction of the conduction path of the device 20. The drift region 50 may include a notched boundary or notched dopant profile in a lateral dimension orthogonal to the line X. The notched boundary or profile may be disposed along an interface between the drift region 50 and the drain region 36. The notched boundary is disposed along the drain-side of the drift region 50, and may be referred to as a drain-side boundary. The notched boundary and the interface are shown more clearly in FIG. 3, as described below. The notched dopant profile is shown more clearly in FIG. 5.

The notched boundary or profile of the drift region 50 may be formed via a corresponding notched boundary or profile of the n-type well region 52. The notched boundary or profile is disposed along the edge 62 of the n-type well region 52, which includes a number of notches 72. Each notch 72 defines an indented section of the edge 62 spaced laterally farther from the drain region 36 than non-indented sections of the edge 62. The non-indented sections may be configured as respective teeth 74, one of which is shown in FIG. 1. Each notch 72 establishes a spacing between a pair of the teeth 74. In this example, the notches 72 in the edge 62 are laterally spaced from a drain-side end or corner 76 of the STI region 44, while the lateral extent of the teeth 74 corresponds with the lateral position of the drain-side corner 76. The lateral extent (e.g., lateral depth) and positioning of the notches 72 and the teeth 74 in the lateral dimension shown in FIG. 1 may vary from the example shown. For example, the notches 72 may be deeper than the example shown, thereby moving the dashed line shown in FIG. 1 toward the channel region 48 and away from the drain region 36. Alternatively or additionally, the lateral positioning of the notches 72 and the teeth 74 may vary.

The diffusion of the n-type well region 52 spreads the dopant present in the teeth 74 in the lateral direction X. The diffusion in the lateral direction X connects the drift region 50 and the drain region 36 as described above. The connection may include or involve the teeth 74 extending laterally toward the drain region 36. An example is shown and described in connection with FIG. 3.

The diffusion of the n-type well region 52 may also spread the dopant in the orthogonal lateral dimension in which the notches 72 and the teeth 74 are defined. An example of such spreading is described below in connection with the graphical plot of the dopant profile shown in FIG. 5.

The notch-shaped boundary or dopant profile of the n-type well region 52 may remain a feature of the drift region 50 despite such lateral spreading of the dopant. The anneal or other step that gives rise to the diffusion may be configured to allow the current paths 68 (FIG. 2) to form, while not allowing the spreading to occur to such an extent that the notched boundary or notched dopant profile is lost. For example, the diffusion may shift the boundary of the notches 72 toward the drain region 36 as shown in FIG. 2. In some embodiments, each tooth 74 may lead to a respective one of the current paths 68.

FIG. 3 is a top view of an exemplary LDMOS device 80 configured in accordance with one embodiment and shown after the diffusion of the well region dopant. The top view depicts two lateral dimensions X and Y of the device 80. The first lateral dimension X corresponds with the lateral dimension X shown in the cross-section of FIG. 1. The second lateral dimension Y corresponds with the orthogonal lateral dimension in which the notched boundary is disposed.

Source regions 82 and a central drain region 84 of the device 80 are spaced from one another along the first lateral dimension X. The conduction path of the device 80 may thus be oriented along the lateral dimension X. The second lateral dimension Y is orthogonal to the first lateral dimension X, and corresponds with the width of the device 80 directed to establishing a desired current density. In this example, the device has a double-fingered channel region under a gate structure 86 having an oval opening 88 that defines a drain-side of the gate structure 86. The channel region is disposed under the gate structure 86 on or above a body region of the device 80, to which a connection is established via body contact regions 90. The device 80 may be an n-channel device as described above. An n-type well region 92 has an outer boundary 94 adjacent the body region and under the gate structure 86. In this example, the body region and the n-type well region 92 are line-on-line, or contiguous. In other embodiments, the n-type well region 92 is spaced from the body region (see, e.g., FIG. 1).

An inner portion of the n-type well region 92 defines a drift region 96 that surrounds and connects with the central drain region 84. The drift region 96 has a notched boundary 98 disposed in the lateral dimension Y along an interface between the drift region 96 and the drain region 84. The notched boundary 98 corresponds with the inner boundary of the n-type well region 92. The notched boundary 98 includes a number of teeth, tines, or other protrusions 100 that couple the drift region 96 and the drain region 84. The teeth 100 may be arranged in a comb-shaped or other periodic pattern. The notched boundary 98 includes a notch or gap 102 between respective pairs of the teeth 100. Each notch 102 along the notched boundary 98 may define an interface with the above-described p-type epitaxial layer. Each notch 102 may thus correspond with a portion of the p-type epitaxial layer not doped by the n-type implant directed to forming the n-type well region 92. Each notch 102 may thus have p-type conductivity. Alternatively, each notch 102 may not have p-type conductivity, but instead an n-type dopant concentration level lower than the dopant concentration level of the teeth 100. In n-type examples, each notch 102 may be very lightly doped (e.g., near the dopant concentration level of the epitaxial layer described herein). In either case, the drift region 96 has a notched dopant profile in the lateral dimension Y to further diminish the drift region 96 to increase the extent to which the drift region 96 is depleted. The RESURF effect may thus be enhanced in the portions of the drift region 96 near the drain region 84, which may be useful when such portions are considerably far from the PN junction along which the depletion occurs. In cases in which the notches 102 present an interface or boundary between an n-type region (e.g., a well region) and a p-type region (e.g., an epitaxial layer), the drift region 84 in areas near the drain region 84 is depleted in both lateral dimensions X, Y, as well as vertically. The depletion may extend the entire lateral extent of the drift region 82 in the OFF state of the device, e.g., when the voltage difference between the drain region 74 and the source regions 72 is high. Such widespread depletion may reduce the electric field in and around the drift region 82 to help raise the breakdown voltage level.

The width of each tooth 100 and the size of each notch 102 along the lateral dimension Y may vary. In some examples, the width of each tooth 100 falls in a range from about 1.0 μm to about 10 μm, although the width of each tooth 100 may be smaller or larger than this range, as well. In some examples, the gap or distance between adjacent teeth 100 (e.g., the size of each notch 102) may fall in a range from about 1.0 μm to about 10 μm, although the distance between adjacent teeth 100 may be smaller or larger than this range, as well. The width of each tooth 100 and/or the size of each notch 102 may be adjusted or customized to achieve various device parameters, including, for instance, the specific on-resistance Rdson and the breakdown voltage BVdss. For example, the lateral width of each tooth 100 (e.g., in the lateral dimension Y) may be adjusted to change the resistivity of the drift region 96. The sizing may vary depending on the dopant concentrations of the drift region 96, which may also vary. The lateral length of each tooth 100 may also vary.

The teeth 100 of the drift region 96 may laterally overlap the drain region 84 along the lateral dimension X. Such lateral overlap may correspond with a thickness of a current path (see, e.g., the current paths 68 in FIG. 2). The lateral overlap may establish the electrical coupling of the drain region 84 and the drift region 96. While such lateral overlap is more easily shown in the cross-sectional view of FIG. 2 than in the top view of FIG. 3, the extent to which the teeth 100 laterally overlap the drain region 84 may vary from the example shown.

The shape of the teeth 100 and the notches 102 may vary from the example shown. The teeth 100 and/or the notches 102 need not present a square-wave or other rectilinear pattern, and may present any type of non-uniform interface between the drift region 96 and the drain region 84. For example, the notched boundary may have a sawtooth or other triangular notch pattern. The notches may alternatively or additionally have rounded corners or sides. The shape and size of the teeth 100 and the notches 102 may differ. The benefits provided by the notched boundary 98 are not based upon charge balancing between the n-type and p-type regions. Significant charge imbalance is, in fact, present along the notched boundary 98.

In the example of FIG. 3, the notched boundary 98 defines an opening 104 in the drift region 96. At least part of the drift region 96 may thus be cutoff under the drain region 84 along the notched boundary 84. The opening 104 may be fully or partially disposed under the drain region 84. In this example, the opening 104 extends beyond the drain region 84 (see, e.g., the notches 102). The opening 104 includes one or more comb-shaped boundaries, such as the boundary 98. In this example, the opening 104 has a comb-shaped boundary on each side of the opening that extends in the lateral dimension Y.

The notched boundary of the opening 104 may exhibit a periodic or regular pattern. In this example, the pattern is a square-wave pattern along the sides disposed in the lateral dimension Y. Other sides or ends of the opening 104 need not exhibit the pattern, or may have a different pattern. In other embodiments, the notched boundary has an aperiodic pattern along one or more sides or ends of the opening 104.

The lateral distribution, arrangement, spacing, size, depth (vertical thickness), configuration, and other characteristics of the teeth 100 may provide design flexibility for the device 80. For example, the BVdss and Rdson values of the device 80 may be tuned to suit a specific application, as described further below. Overall conduction through the drift region 96 may be addressed across the lateral dimension Y. Adjustments to the notched dopant profile may be made to accommodate application specifications, allowing other characteristics of the device 80, such as the channel width of the device 80, to be configured as desired. The notched dopant profile is compatible with a variety of device designs. For instance, the device 80 may have a double-fingered channel arrangement with a lateral width that may be sized as desired.

The above-described devices are shown in simplified form. For example, FIGS. 1-3 do not show the conductive (e.g., ohmic) contacts and other metal layers configured for electric coupling with the source regions, the drain regions, and the gate structures. The devices may have a number of other structures or components for connectivity, isolation, passivation, and other purposes not shown in FIG. 1 for ease in illustration. For instance, the devices may include any number of additional isolating regions or layers. In some examples, another p-type epitaxial layer (not shown) may be disposed between the original substrate and the device area. One or more further STI regions, other isolation trenches, and/or isolation wells (not shown) may be provided to isolate the device area and/or other region of the device.

The dopant concentrations, thicknesses, and other characteristics of the above-described semiconductor regions in the semiconductor substrate 22 may vary. In one example of the embodiment shown in FIG. 1, the above-referenced semiconductor regions may have the following approximate concentrations and thicknesses:

|  | Concentration | Thickness |
| --- | --- | --- |
| p-epi 24: | $1 \times 10^{13}$-$1 \times 10^{15}$/cm$^3$ | 3-10 μm |
| substrate 26: | $1 \times 10^{15}$-$1 \times 10^{18}$/cm$^3$ | not applicable |
| body 30: | $1 \times 10^{16}$-$1 \times 10^{18}$/cm$^3$ | 0.5-1.5 μm |
| source 34: | $1 \times 10^{21}$-$5 \times 10^{21}$/cm$^3$ | 0.15-0.25 μm |
| drain 36: | $1 \times 10^{21}$-$5 \times 10^{21}$/cm$^3$ | 0.15-0.25 μm |
| NLDD 46: | $1 \times 10^{18}$-$1 \times 10^{19}$/cm$^3$ | 0.2-0.3 μm |
| n-well 52: | $5 \times 10^{15}$-$5 \times 10^{17}$/cm$^3$ | 0.5-1.5 μm |

The concentrations and thicknesses may be different in other embodiments. For example, the dopant concentration of the original substrate 26 may vary considerably.

Figure 4:
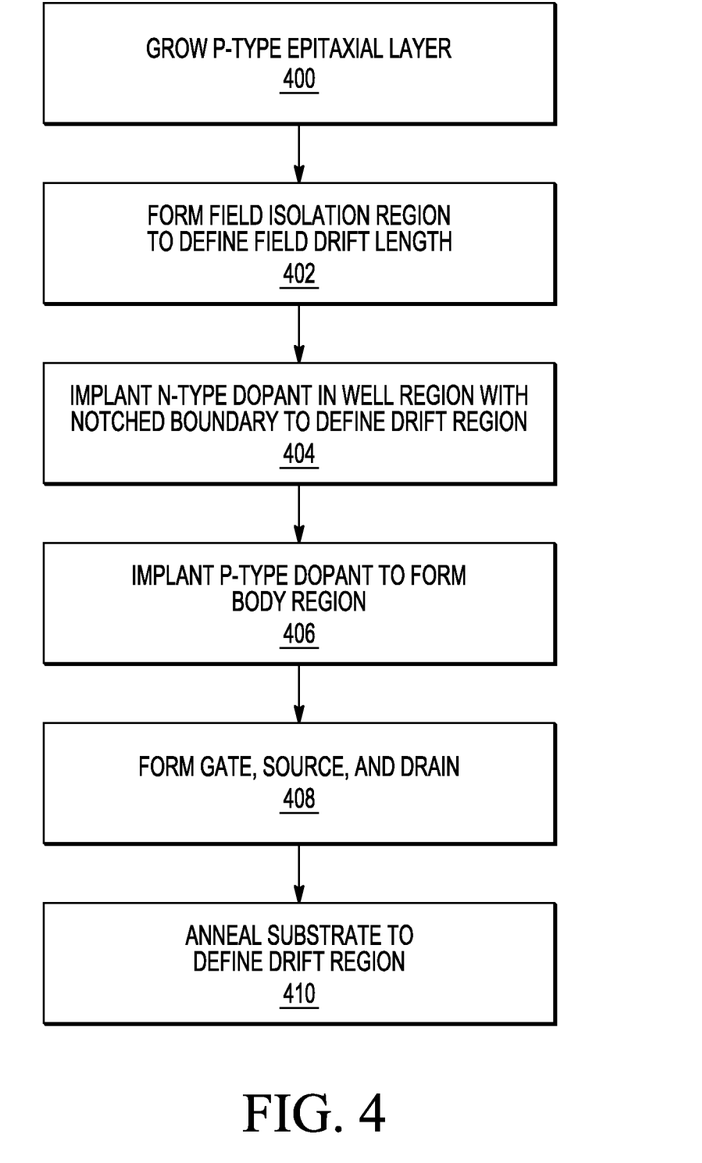
FIG. 4 is a flow diagram of an exemplary fabrication sequence to construct an LDMOS transistor having a notched dopant profile in accordance with one embodiment.

FIG. 4 shows an exemplary fabrication method for fabricating a device with a drift region having a notched dopant profile or notched drain-side boundary as described above. The method may be directed to fabricating a reduced surface field (RESURF) transistor having one or more of the features described above. The transistor is fabricated with a semiconductor substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. The fabrication method is not limited to any particular doping mechanism, and may include future developed doping techniques.

The method may begin with, or include, an act 400 in which a p-type epitaxial layer (p-epi) is grown on a heavily doped p-type semiconductor substrate. In some cases, the act 400 includes the formation via, e.g., ion implantation, of one or more buried device isolation layers before the growth of the epitaxial layer. The buried device isolation layer(s) may be configured via a mask to extend across an active area of the RESURF transistor. In some cases, the act 400 includes the growth of another p-type epitaxial layer. Any number of epitaxial layers may be grown.

In this embodiment, an STI region (or field isolation region) is formed in act 402 in the substrate to define the field drift length. The STI region may be formed via any now known or hereafter developed procedure. For example, the act 402 may include the formation of a trench and the deposition (e.g., chemical vapor deposition, or CVD) of one or more materials in the trench. In some embodiments, the trench is filled with silicon oxide. Additional or alternative materials may be deposited. In an alternative embodiment, the STI region is formed after the drift region is formed.

In act 404, the substrate is doped in a well region of the epitaxial layer. The well region may be directed to forming the accumulation region and the drift region of the transistor. The doping procedure may include an n-type dopant implantation. For example, the well region may be formed with a mask such that the well region is configured as shown in FIG. 1. The well region may thus have a lateral profile with an upright, vertical, or other cut-off on the drain side of the drift region to diminish the drift region at or under the drain region, as described above. For example, the well region may include an opening under the drain region, as described above. In some cases, the lateral extent of the well region does not overlap the location of the drain region. The drain side of the well region also includes a notched boundary along a lateral dimension orthogonal to the lateral dimension shown in the cross-section of FIG. 1. The notched boundary may be disposed along the opening in the well region. The ion implantation procedure may be combined with one or more annealing or other diffusion procedures that distribute the implanted dopant ions toward a second or final profile or region for the drift region, as described herein. The resulting drift region may thus also include a notched boundary (e.g., in open-drain embodiments having an opening under the drain region) or notched dopant profile (e.g., in closed-drain embodiments without an opening under the drain region) as described herein.

In act 406, a p-type well is formed by doping a body region of the substrate. In some embodiments, the act 406 includes an implantation procedure. The body region may be spaced from or adjacent to the drift region as described above. A heavily doped p-type contact region for the body region may be formed in the p-type well via a separate ion implantation procedure.

The fabrication process may then include one or more procedures collectively shown in act 408. The procedures may be implemented in various orders. Additional or alternative procedures may be implemented. A gate structure may initially be formed. Source and drain regions may then be formed, using the gate structure for self-alignment of the source region. One or more n-type ion implantation procedures may be performed. For example, formation of one or both of the source region and the drain region may include a moderate implant before formation of sidewall spacers of the gate structure to create one or more transition regions (see, e.g., FIG. 1). A heavy implant after formation of the sidewall spacers may then be implemented to form the source and/or drain regions adjacent to such transition regions.

The drain region may or may not be formed in the act 408 in a region that laterally overlaps with the well region formed in the act 404. The overlap may define a conduction path for the transistor. The overlap, however, does not extend laterally across the region in which the drain is formed, as described above and shown in FIG. 1.

In act 410, the substrate is annealed. The manner in which the annealing procedure is implemented may vary. The annealing procedure may result in redistributing the dopant ions for the drift region to form one or more current paths from the well region to the drain region. The drift region may thus be electrically coupled to the drain region. In some cases, the drift region extends laterally across the drain region, but in a diminished capacity as described above.

The implantation and annealing procedures may be configured such that the drift region under or along the drain region includes a first section in the conduction path and a second, thinner section outside of the conduction path. The first section may thus form a current pass or path, while the second section is configured to enhance the RESURF effect through easier depletion. The first section may have a higher dopant concentration level than the second section to maintain a suitably low resistance for the current pass.

Additional acts may be implemented at various points during the fabrication procedure. For example, one or more acts may be directed to defining an active area of the device. In some cases, such acts may include the formation of one or more device isolating wells, layers, or other regions. One or more metal layers may be deposited. Any number of additional STI regions may be formed.

Figure 5:
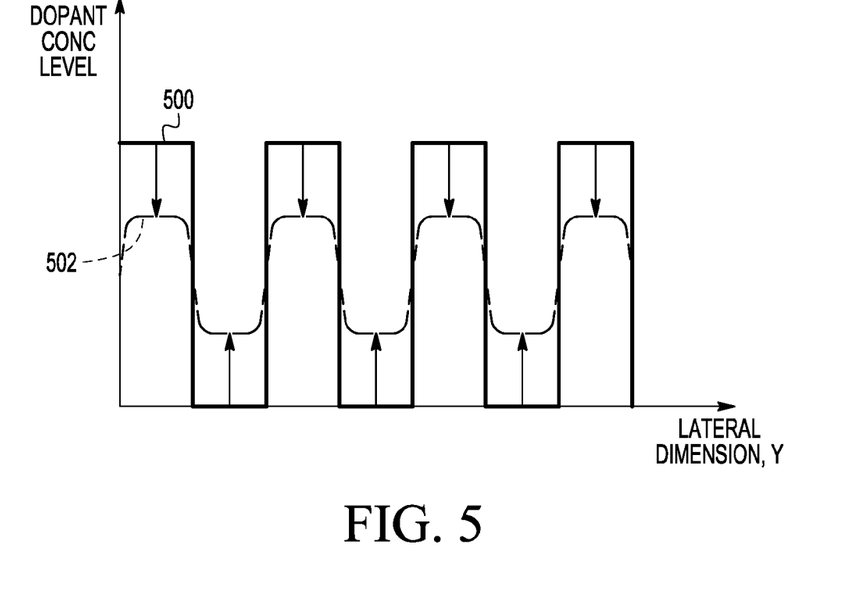
FIG. 5 is a graphical plot of dopant concentration level in a drift region before and after an annealing step as a function of a lateral dimension orthogonal to a conduction path.

FIG. 5 is a graphical plot of the dopant concentration level of the drift region along the interface with the drain region. The plot shows the dopant concentration level as a function of the lateral dimension Y (FIG. 3). The dopant concentration levels may be for a position along the other lateral dimension X between the cutoff or edge 62 (FIG. 1) and the notch 72 (FIG. 1).

A solid line 500 depicts the dopant concentration level before diffusion. For instance, the solid line may indicate the dopant profile of the n-type well region 52 as shown in FIG. 1. The effects of the diffusion are shown via a dashed line 502. The pre-diffusion peak levels of the solid line 500 have been reduced as a result of dopant diffusing into the pre-diffusion valleys associated with the notches. The peak dopant concentration levels may also decrease as a result of diffusion in the other lateral direction X, which forms the conduction paths between the drift and drain regions.

In some embodiments, the lateral diffusion in the lateral dimension Y shown in FIG. 5 also fills in the notches between the conduction paths. The notched dopant profile may thus represent alternating regions of moderate doping and light doping. Even when the light doping of the notches results in an n-type doped interface, the interface with the drain region is not uniform. The periodic presence of the lightly doped regions may still diminish the drift region (through a lower dopant concentration level) to thereby enhance the RESURF effect.

The dopant concentration levels of the above-described drift regions may be used to define the drain-side boundaries of the drift regions. The dopant concentration levels may vary as a square wave, sine wave, or other varying function along the edge of the drain in the lateral dimension Y. The above-described teeth may correspond with relatively high dopant concentrations. The dopant concentration levels may reach or approach zero within the spaces between the teeth.

In a first aspect, a device includes a semiconductor substrate, source and drain regions in the semiconductor substrate and spaced from one another along a first lateral dimension, and a drift region in the semiconductor substrate and through which charge carriers drift during operation upon application of a bias voltage between the source and drain regions. The drift region has a notched dopant profile in a second lateral dimension along an interface between the drift region and the drain region.

In a second aspect, an electronic apparatus includes a semiconductor substrate and a reduced surface field (RESURF) transistor disposed in the semiconductor substrate. The RESURF transistor includes a first semiconductor region having a first conductivity type and in which a channel is formed during operation, second and third semiconductor regions having a second conductivity type and spaced from one another along a first lateral dimension, and a fourth semiconductor region having the second conductivity type and through which charge carriers from a channel formed in the first semiconductor region during operation drift upon application of a bias voltage between the second and third semiconductor regions. The fourth semiconductor region has a notched dopant profile in a second lateral dimension along an interface between the third and fourth semiconductor regions.

In a third aspect, a method of fabricating a transistor includes implanting dopant in a first region of a substrate for formation of a drift region, and forming source and drain regions in second and third regions of the substrate, respectively, the second and third regions being spaced from one another in a first lateral dimension. The first region does not extend laterally across the third region and comprises a notched drain-side boundary in a second lateral dimension.

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" may be used even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
   a semiconductor substrate;
   source and drain regions in the semiconductor substrate and spaced from one another along a first lateral dimension; and
   a drift region in the semiconductor substrate and through which charge carriers drift during operation upon application of a bias voltage between the source and drain regions;
   wherein:
   the drift region and the drain region are connected to one another at an interface; and
   the drift region has a notched boundary in plan view in a second lateral dimension along the interface between the drift region and the drain region.

2. The device of claim 1, wherein:
   the drift region comprises an opening under the drain region; and
   the opening comprises a comb-shaped boundary.

3. The device of claim 1, wherein the drift region narrows in vertical thickness at the drain region at the interface between the drift region and the drain region.

4. The device of claim 1, wherein the drift region does not extend laterally across the drain region.

5. The device of claim 1, wherein:
   the drift region comprises an outer section and an inner section surrounded by the outer section and disposed under the drain region; and
   the inner section is diminished relative to the outer section such that full depletion of the drift region is attainable during operation.

6. The device of claim 1, wherein the notched boundary comprises a square wave notch pattern.

7. The device of claim 1, wherein the notched boundary comprises a periodic notch pattern.

8. The device of claim 1, wherein:
   the semiconductor substrate comprises an epitaxial layer in which the source, drain, and drift regions are formed; and
   the drift region is cutoff under the drain region along a notched boundary with the epitaxial layer.

9. The device of claim 1, further comprising a trench isolation region in the semiconductor substrate between the source and drain regions, wherein:
   the drift region comprises a first region under the trench isolation region and second region under the drain region; and
   the drift region has a diminished dopant concentration level in the second region relative to the first region.

10. The device of claim 1, wherein the notched boundary comprises a comb-shaped boundary.

11. The device of claim 1, wherein:
    the drift region laterally overlaps the drain region; and
    the drift region does not extend across an entire lateral extent of the drain region.

12. The device of claim 1, wherein:
    the notched boundary comprises teeth of the drift region; and
    the teeth couple the drift region and the drain region.

13. The device of claim 1, wherein:
    the drift region comprises teeth along the notched boundary;
    the teeth laterally overlap the drain region; and
    the teeth do not extend across an entire lateral extent of the drain region.

14. The device of claim 1, wherein the drift region is narrower in thickness under the drain region relative to a section of the drift region not under the drain region.

15. An electronic apparatus comprising:
    a semiconductor substrate; and
    a reduced surface field (RESURF) transistor in the semiconductor substrate and comprising:
       a first semiconductor region having a first conductivity type and in which a channel is formed during operation;

second and third semiconductor regions having a second conductivity type and spaced from one another along a first lateral dimension; and a fourth semiconductor region having the second conductivity type and through which charge carriers from the channel formed in the first semiconductor region during operation drift upon application of a bias voltage between the second and third semiconductor regions;

wherein:

the third semiconductor region and the fourth semiconductor region are connected to one another at an interface; and the fourth semiconductor region has a notched boundary in plan view in a second lateral dimension along the interface between the third and fourth semiconductor regions.

16. The electronic apparatus of claim 15, wherein:

the fourth semiconductor region comprises an opening under the third semiconductor region; and the opening comprises a comb-shaped boundary.

17. The electronic apparatus of claim 15, wherein the fourth semiconductor region does not extend laterally across the third semiconductor region.

18. The electronic apparatus of claim 15, wherein the fourth semiconductor region comprises an outer region and an inner region surrounded by the outer region and disposed under the third semiconductor region; and the inner region is diminished relative to the outer section such that full depletion of the fourth semiconductor region is attainable during operation.

19. The electronic apparatus of claim 15, wherein the semiconductor substrate comprises an epitaxial layer in which the first, second, third, and fourth semiconductor regions are formed; and the fourth semiconductor region is cutoff under the third semiconductor region along a notched boundary with the epitaxial layer.

20. The electronic apparatus of claim 15, wherein the RESURF transistor further comprises a trench isolation region between the second and third semiconductor regions, wherein:

the fourth semiconductor region comprises a first region under the trench isolation region and a second region under the third semiconductor region; and the fourth semiconductor region has a diminished dopant concentration level in the second region relative to the first region.

* * * * *